United States Patent
Hsu et al.

(10) Patent No.: US 9,011,638 B2
(45) Date of Patent: Apr. 21, 2015

(54) CHIP SORTING APPARATUS

(71) Applicant: Epistar Corporation, Hsinchu (TW)

(72) Inventors: Chen-Ke Hsu, Hsinchu (TW); Liang Sheng Chi, Hsinchu (TW); Chun-Chang Chen, Hsinchu (TW); Win-Jim Su, Hsinchu (TW); Hsu-Cheng Lin, Hsinchu (TW); Mei-Ling Tsai, Hsinchu (TW); Yi Lung Liu, Hsinchu (TW); Chen Ou, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 14/220,060

(22) Filed: Mar. 19, 2014

(65) Prior Publication Data
US 2014/0202627 A1 Jul. 24, 2014

Related U.S. Application Data

(63) Continuation of application No. 12/842,112, filed on Jul. 23, 2010, now Pat. No. 8,714,227.

(30) Foreign Application Priority Data
Jul. 23, 2009 (TW) ................................. 98124963 A

(51) Int. Cl.
*B32B 38/10* (2006.01)
*H01L 21/66* (2006.01)
*H01L 21/67* (2006.01)

(52) U.S. Cl.
CPC .......... *H01L 22/20* (2013.01); *H01L 21/67005* (2013.01); *H01L 21/67132* (2013.01); *H01L 21/67271* (2013.01); *Y10S 156/93* (2013.01); *Y10S 156/941* (2013.01)

(58) Field of Classification Search
CPC ................................ H01L 21/00; B32B 31/00
See application file for complete search history.

(56) References Cited

U.S. PATENT DOCUMENTS

| | | | |
|---|---|---|---|
| 4,990,051 A | 2/1991 | Safabakhsh et al. | |
| 5,171,717 A * | 12/1992 | Broom et al. | 438/33 |
| 5,273,615 A * | 12/1993 | Asetta et al. | 156/750 |
| 5,589,029 A | 12/1996 | Matsui et al. | |
| 5,971,250 A | 10/1999 | Safabakhsh et al. | |
| 6,629,553 B2 | 10/2003 | Odashima et al. | |
| 6,709,543 B2 | 3/2004 | Kurosawa | |
| 6,792,991 B2 * | 9/2004 | Thallner | 156/539 |
| 6,824,643 B2 | 11/2004 | Yoshimoto et al. | |
| 6,896,762 B2 | 5/2005 | Huang et al. | |
| 7,303,647 B2 | 12/2007 | Cheung et al. | |
| 7,445,688 B2 | 11/2008 | Suzuki et al. | |

(Continued)

FOREIGN PATENT DOCUMENTS

| | | |
|---|---|---|
| CN | 101009230 A | 8/2007 |
| EP | 0298496 A2 | 1/1989 |

*Primary Examiner* — Mark A Osele
*Assistant Examiner* — Nickolas Harm
(74) *Attorney, Agent, or Firm* — Patterson & Sheridan, LLP

(57) ABSTRACT

A method of chip sorting comprises providing a chip holder having a first surface; providing multiple chips on the first surface; providing a chip receiver having a second surface, wherein the second surface faces the first surface; attaching the multiple chips to the second surface; decreasing an adhesion between the multiple chips and the first surface; and separating the multiple chips from the first surface after the step of decreasing the adhesion between the multiple chips and the first surface.

16 Claims, 9 Drawing Sheets

(56) References Cited

U.S. PATENT DOCUMENTS

| | | | |
|---|---|---|---|
| 7,989,266 B2 * | 8/2011 | Borthakur et al. | 438/110 |
| 8,383,460 B1 * | 2/2013 | Yim | 438/118 |
| 2004/0238117 A1 | 12/2004 | Kasai | |
| 2008/0008565 A1 | 1/2008 | Thallner | |
| 2008/0157358 A1 * | 7/2008 | Yang | 257/737 |
| 2008/0227239 A1 | 9/2008 | Shibata et al. | |
| 2008/0264563 A1 * | 10/2008 | Kuczynski et al. | 156/344 |

* cited by examiner

CHIP SORTING APPARATUS

CROSS-REFERENCE TO RELATED APPLICATIONS

This application is a continuation application of U.S. patent application Ser. No. 12/842,112, filed on Jul. 23, 2010, now pending, which claims the right of priority based on TW application Serial No. 098124963, filed on Jul. 23, 2009, and the content of which is hereby incorporated by reference in its entirety.

BACKGROUND

1. Technical Field

The present application relates to a chip sorting apparatus and the sorting method thereof.

2. Description of the Related Art

In a semiconductor process, each wafer has to go through a multiple or hundreds of procedures. A plurality of defined regions is formed on the wafer to be diced into a plurality of chips. These defined regions subject to a series of tests before or after chip dicing. For example, in the light-emitting diode manufacture process, the wafer goes through the evaporation process for forming electrodes and the lithography and etching process for forming scribing lines to separate the wafer into chips. After running a probe test in the chips, the testing data is written as a code in a wafer map file, and those chips meet the customers' or users' requirement are sorted according to the wafer map file. A sorter chooses the qualified chips by the wafer map file corresponding to the chips, and put the qualified chips on a bin table one by one until finishing the sorting. It takes a lot of time for the machine arm of the sorter to work back and forth during the sorting process. For example, a commercial sorter can choose four chips per second, so it takes about three hours to sort forty thousand chips from wafers which decreasing the production efficiency.

SUMMARY OF THE DISCLOSURE

A chip sorting apparatus comprises a chip holder including a first surface and a second surface opposite to the first surface; a wafer including a first chip disposed on a first position of the first surface; a first chip receiver including a third surface and a fourth surface opposite to the third surface, wherein the third surface is opposite to the first surface; a pressurization device making the first chip and the third surface of the first chip receiver adhering to each other through pressuring the second surface at where corresponding to the first position; and a separator decreasing the adhesion between the first chip and the first surface.

A method of chip sorting comprises providing a chip holder having a first surface; providing multiple chips on the first surface; providing a chip receiver having a second surface, wherein the second surface faces the first surface; attaching the multiple chips to the second surface; decreasing an adhesion between the multiple chips and the first surface; and separating the multiple chips from the first surface after the step of decreasing the adhesion between the multiple chips and the first surface.

A chip sorting method comprises providing a chip holder comprising a first surface and a second surface opposite to the first surface; attaching a wafer including a first chip to a first position of the first surface; providing a first chip receiver comprising a third surface and a fourth surface opposite to the third surface, wherein the third surface is opposite to the first surface; moving the chip holder and/or the first chip receiver to place the third surface of the first chip receiver facing the first surface of the chip holder; providing a pressurization device; driving the pressurization device to make the first chip and the third surface adhering to each other through pressuring the second surface at where corresponding to the first position; providing a separator; and driving the separator to act on the chip holder to decrease the adhesion between the first chip and the first surface of the chip holder.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DESCRIPTION OF THE PREFERRED EMBODIMENTS

Figure 1:
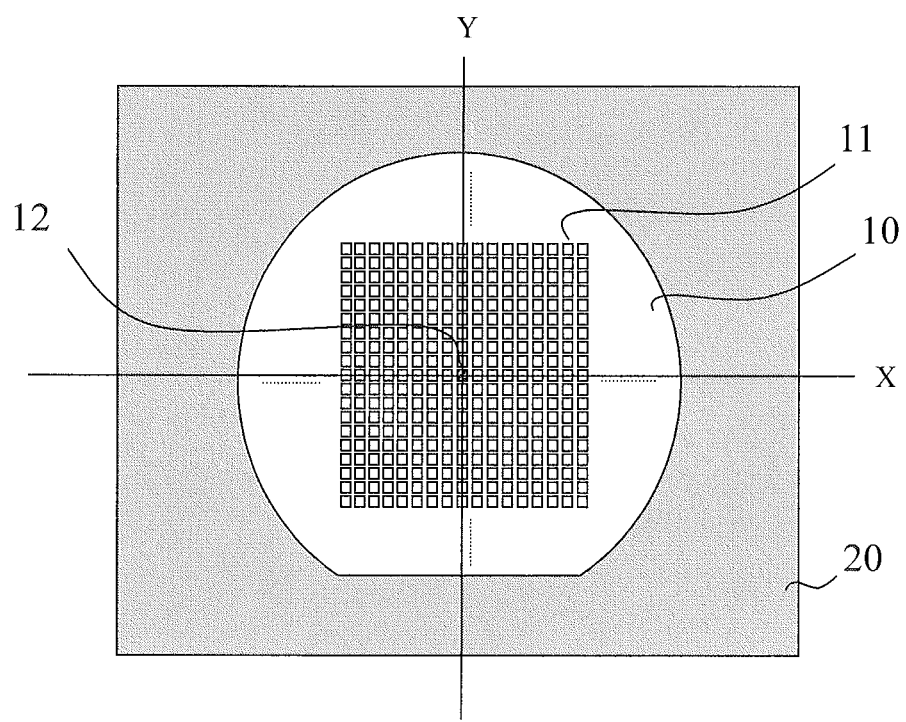
FIG. 1 illustrates a top view of the chip sorting apparatus in accordance with one embodiment of the present application.

Reference is made in detail to the preferred embodiments of the present application, examples of which are illustrated in the accompanying drawings. Wherever possible, the same reference numbers are used in the drawings and the description to refer to the same or like parts.

Refer to FIGS. 1-6. FIG. 4A illustrates a schematic view of a chip sorting apparatus 110 in accordance with one embodiment of the present application. The chip sorting apparatus 110 includes a wafer 10, a chip holder 20, a chip receiver 50, a pressurization device 70, and a separator 80. FIG. 1 illustrates a part of the top view of the chip sorting apparatus 110. In FIG. 1, the wafer 10 includes a plurality of defined regions for chip. The plurality of defined regions for chip are defined by lithography and etching processes and then cut into a plurality of separated chips 11. A center chip 12 is disposed on the center of the wafer 10. The center chip 12 includes a pattern used for positioning in the following processes. The wafer 10 is disposed on the chip holder 20 after cutting. The material of the chip holder 20 can be an adhesive material such as blue tapes or UV tapes. In the embodiment, the blue tape is used as the chip holder 20. The aforementioned cutting process can also be performed after attaching the wafer 10 to the blue tape. In the chip sorting apparatus 110, the X/Y coordinates of each chip are defined by referring the center chip 12 as the origin. The optoelectronic data of each chip, such as wavelength, luminance, driving voltage, and/or current, has been built up and stored in the wafer map file during the test process. The position of each chip on the blue tape is arranged according to the defined coordinates during the test process. The surface of chip adhered on the tape can be the front surface or back surface of the chip.

Figure 2:
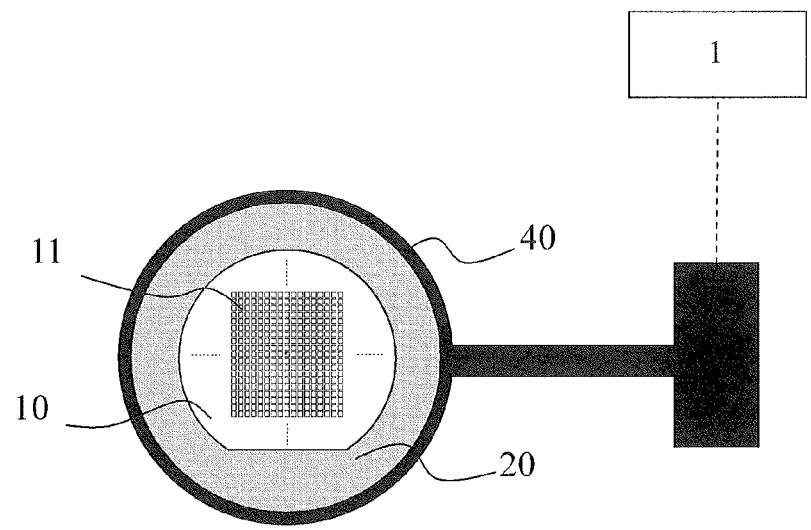
FIG. 2 illustrates a top view of the chip sorting apparatus in accordance with one embodiment of the present application.
Figure 3:
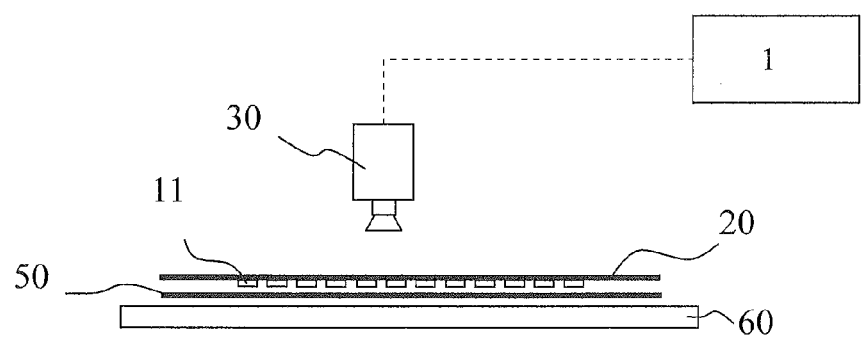
FIG. 3 illustrates a cross-sectional view of the chip sorting apparatus in accordance with one embodiment of the present application.

Refer to FIGS. 2 and 3. FIG. 2 illustrates a part of the top view of the chip sorting apparatus 110, and FIG. 3 illustrates a part of the side view of the chip sorting apparatus 110. After the wafer 10 is adhered to the tape, the wafer 10 can be fixed on a first plane table 40. In the embodiment, the first plane table 40 is an expansion ring connected with the chip holder 20 exposing the wafer 10 and the chip holder 20. The chip sorting apparatus 110 further comprises a chip positioner 30 to adjust the wafer to a predetermined position. In the embodiment the chip positioner 30 is an image recognition machine to position the chips on the wafer 10. The image recognition machine is disposed above the chip holder 20. Turning the surface of the wafer 10 not adhered to the tape upside down to fix the wafer 10 with the first plane table 40. The chip 11 is positioned with the center chip 12 as the origin of the coordinates and driving the first plane table 40 according to a signal 1 from the chip positioner 30 to move the wafer 10 to a predetermined position.

In one embodiment, the first plane table 40, such as an expansion ring, is fixed in a range that the chip positioner 30 is able to recognize. After fixing the chip holder 20, the position of the center chip 12 and the relative position of chip 11 are recognized through the chip positioner 30 to finish the chip positioning.

The first chip receiver 50 is disposed on a second plane table 60 under the wafer 10 and can be an adhesive tape, such as a blue tape or a UV tape. In the embodiment, the chip receiver 50 is a blue tape used to collect the sorted chip from the proceeding processes. The area of the blue tape is greater than or equal to that of the wafer 10, and the position of the blue tape is under the wafer 10 where the chips sorted from the wafer 10 can be collected completely.

In one embodiment, the difference to the above embodiments is the chip receiver 50 and the second plane table 60 can be transparent or semi-transparent. The image recognition machine can be disposed under the chip receiver 50 and the second plane table 60, and the wafer 10 can be positioned through seeing through the chip receiver 50 and the second plane table 60.

In one embodiment, the first plane table 40 is fixed in a predetermined position which has to be in a recognizable region to the chip positioner 30. Next, the chip holder 20 is moved to the first plane table 40, adjusted into the recognizable region of the chip positioner 30, and fixed on the first plane table 40. The chip positioner 30 then recognizes the position of the center chip 12 and the relative position of other chips to finish the chip positioning.

Figure 4A:
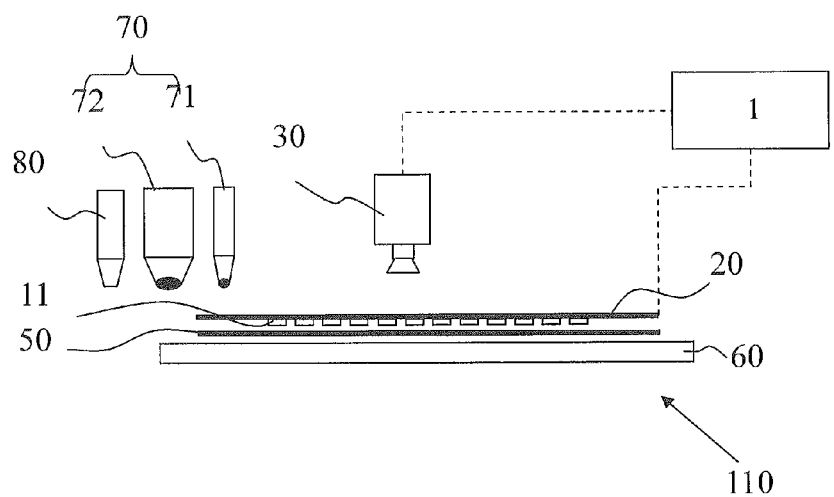
FIGS. 4A-4F illustrate a process of the chip sorting method in accordance with one embodiment of the present application.
Figure 4B:
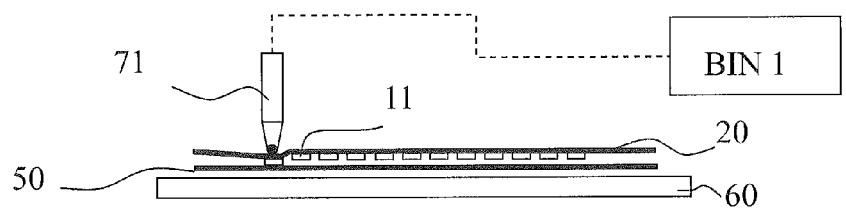
Figure 4C:
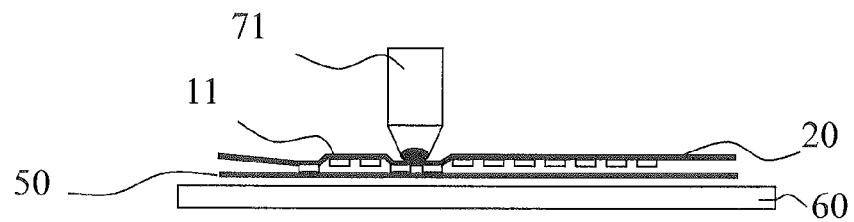

The chip sorting apparatus 110 further comprises the pressurization device 70 and the separator 80. Referring to FIG. 4A, in the embodiment, the pressurization device 70 includes two pressurization pens 71 and 72. In the chip sorting process, the wafer map file produced from a probing test includes the optoelectronic data of each chip, and the chips can be selected according to the optoelectronic data that satisfies the customers' requirement. Then the position data of these chips satisfying the customers' requirement are transferred to the pressurization device 70 through the chip positioner 30 to drive the pressurization device 70 pressurizing on a position of the chip holder 20 corresponding to the selected chip, and the surfaces of the selected chips not contacted to the chip holder 20 is contacted with the chip receiver 50. The pressurization device 70 can choose different pressurization pens with different size according to the chip size. In the embodiment, the chip receiver 50 is a blue tape. The pressurization pen 71 with large size is for large chip, and the pressurization pen 72 with small area is for small chip.

Then, the adhesion between the chip 11 and the chip holder 20 can be decreased through the separator 80. In the embodiment, the separator 80 is a liquid spreading apparatus such as an injector which can spread an adhesive-removal solvent 81 such as acetone on the region the pressurization device 70 pressurizing on, and it can decrease the adhesion between the selected chip and the chip holder 20. Then the chip holder 20 is moved to separate the selected chip from the chip holder 20. The separated chip 13 is attached on the chip receiver 50 which is a blue tape and the first separating process is finished.

FIGS. 4A-4F illustrate the chip sorting method in accordance with the first embodiment of the present application. The method includes steps as follows. First, providing the wafer 10 including a substrate for manufacturing LEDs. The material of the substrate includes sapphire, silicon, GaP, GaAs, AlN or GaN. In the embodiment, the wafer 10 is a two inch GaN wafer including the plurality of chips 11. Each chip is surrounded by a plurality of scribing lines, and the center chip 12 is disposed on the center of the wafer 10. The wafer is disposed on the chip holder 20. In the embodiment, the chip holder 20 is a blue tape, and the wafer 10 is attached on the blue tape through the adhesion of the blue tape. Next, the chips on the wafer 10 are positioned through the chip positioner 30. In the embodiment, the chip positioner 30 is an image recognition machine. The surface of the wafer 10 not adhered to the tape is turned upside down and connected with the first plane table 40. The center chip 12 is disposed on a predetermined position and the relative position of the chip 11 is recognized by moving the first plane table 40 according to the signal 1 from the image recognition machine to finish the chip positioning process. Then the chip receiver 50 is provided under the wafer 10 wherein the chip receiver 50 is a blue tape.

The next step is chip sorting. Referring to above content, the wafer map file is generated during the probe test process. The chip is selected according to a first optoelectronic data in the wafer map file satisfying the customer's requirement, and the selected chips is collected on the chip receiver 50. In the embodiment, the qualified chip is represented by the symbol BIN 1. If the customer has another requirement, the chips with a second optoelectronic characteristic satisfying such requirement are selected according to the datum in the wafer map file, which is represented by the symbol BIN 2. Referring to FIGS. 4A-4C and 5, FIG. 5 is a top view of FIG. 4B. The position data of the chips categorized to BIN 1 is transferred to the pressurization device 70, a suitable pen is then selected by determining the chip size of the BIN 1 chips from the input data, and the pressurization device 70 is driven for the pressurization pen pressures on a position of the chip holder 20 corresponding to the position of the BIN 1 chips to make the surface not contacted to the chip holder 20 to be contacted with the blue tape of the chip receiver 50.

Figure 4D:
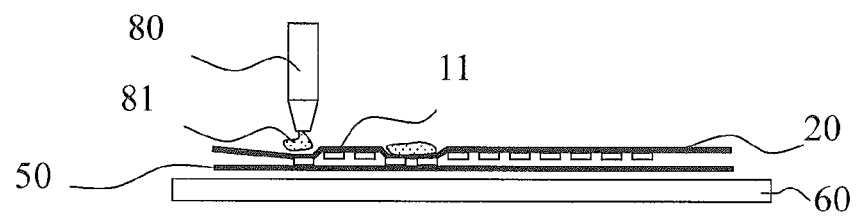
Figure 4E:
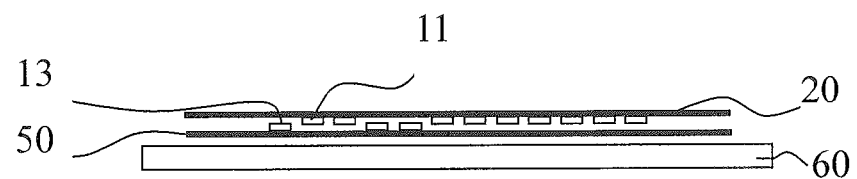

Referring to FIGS. 4D-4E, the chip 10 is separated from the chip holder 20 by the separator 80. In the embodiment, the separator 80 is a liquid spreading apparatus like an injector which can spread an adhesive-removal solvent 81 like acetone on where the pressurization device 70 pressuring on. The acetone infiltrates into the adhesion surface between the chip holder 20 and the BIN 1 chips, and decreases the adhesion of the blue tape. Then the second plane table 60 is moved with the chip holder 20. The adhesion between the chip receiver 50 and the chips is greater than that between the chip holder 20 and the chips after the acetone is spread, so it is easy to separate the chips from the chip holder 20 by moving the second plane table 60. The separated BIN 1 chips 13 are attached on the blue tape of the chip receiver 50 and the first separating process is finished.

Figure 4F:
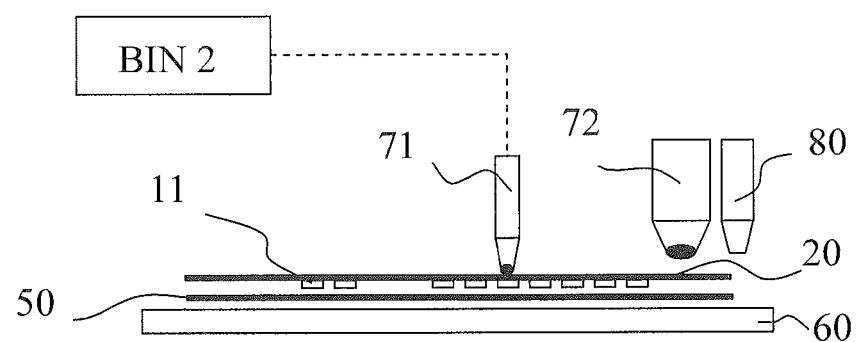
Figure 5:
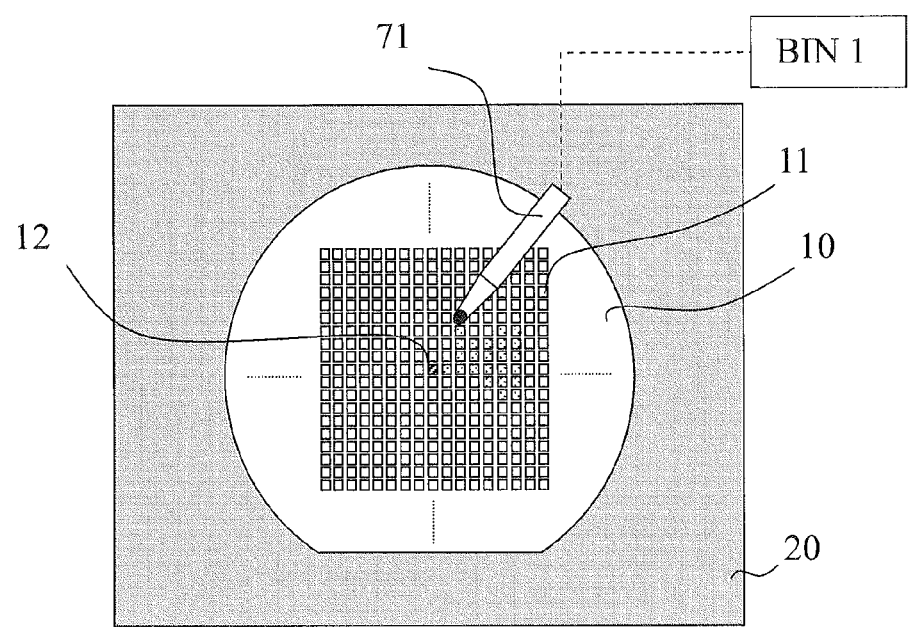
FIG. 5 illustrates a top view of the chip sorting apparatus in accordance with one embodiment of the present application.
Figure 6:
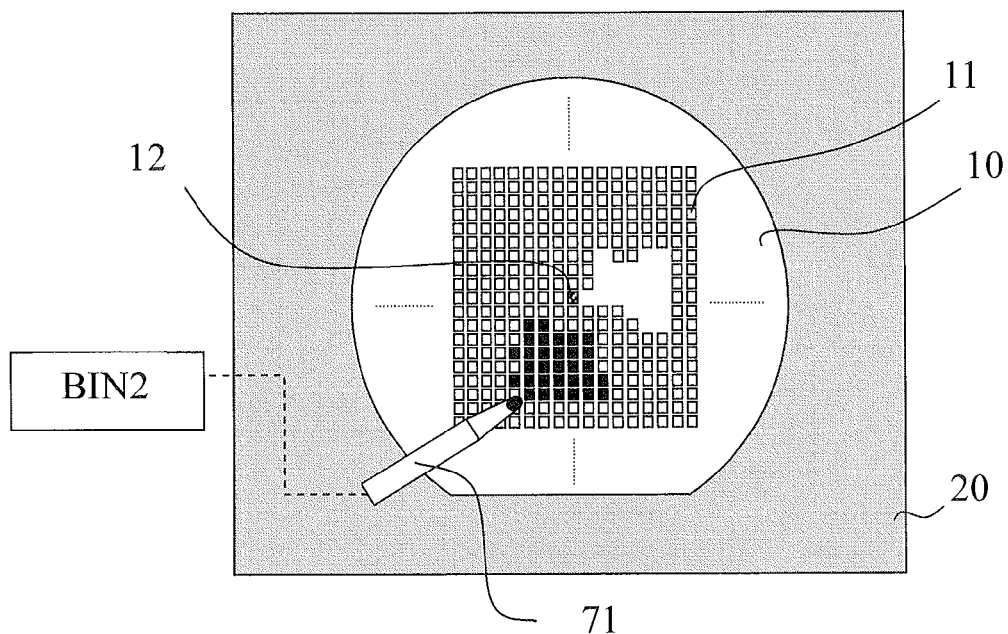
FIG. 6 illustrates a top view of the chip sorting apparatus in accordance with one embodiment of the present application.

Refer to FIGS. 4F and 6. FIG. 6 is a top view of FIG. 4F. The next step is replacing a new blue tape by moving the second plane table 60, and repeating above chip sorting steps to proceed for sorting the BIN 2 chips. The chips with a third optoelectronic characteristic according customers' requirement can be sorted out from the remaining chips on the chip holder 20, and take three pieces of blue tapes orderly as the chip receivers for repeating the above chip sorting steps to finish the chip sorting. The number of the chip receiver 50 depends on the number of sorting steps.

In one embodiment, after the acetone is spread, the adhesion between the BIN 1 chips and the chip holder 20 is decreased, and the blue tape for the chip holder 20 or the blue tape for the chip receiver 50 can be torn off by hand. The BIN 1 chips are adhered on the blue tape of the chip receiver 50, and other chips are left on the blue tape of the chip holder 20. The chip sorting is finished, and the other chip sorting can be proceeded.

Figure 7:
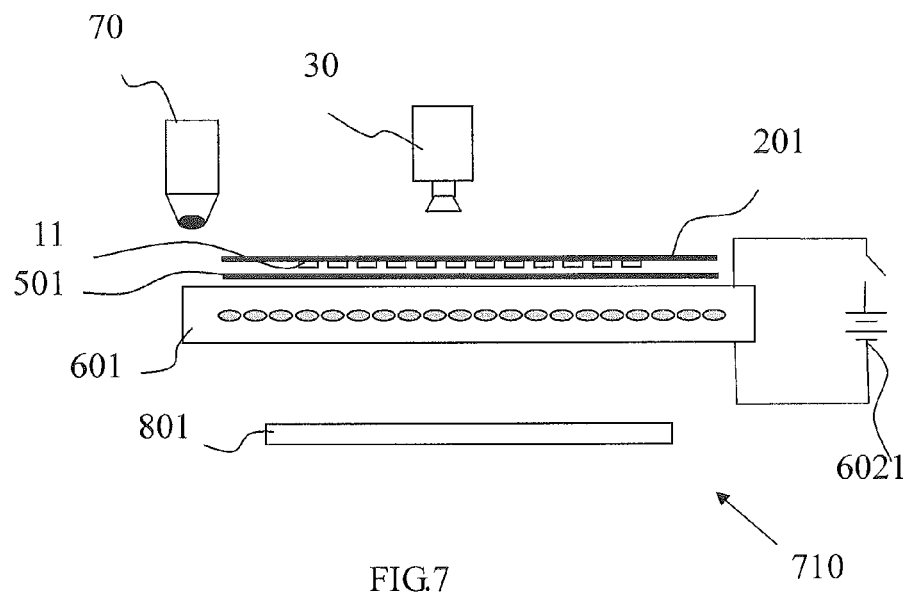
FIGS. 7-10 illustrate a process of the chip sorting method in accordance with one embodiment of the present application.

Referring to FIG. 7, it illustrates a schematic view of a chip sorting apparatus 210 in accordance with one embodiment of the present application. A chip holder 201 is a UV tape. A chip receiver 501 is a non-UV tape, and the better type is the tape with an adhesion that can not be decreased through the UV light. The adhesion between the chip holder 201 and the chip 11 is greater than that between the chip receiver 501 and the chip 11. In the embodiment, the chip receiver 501 is disposed on a second plane table 601. The second plane table 601 can be a liquid crystal panel including two conductive glass sheets and liquid crystal material interposed between thereof, and includes a current controller 602.

Figure 8:
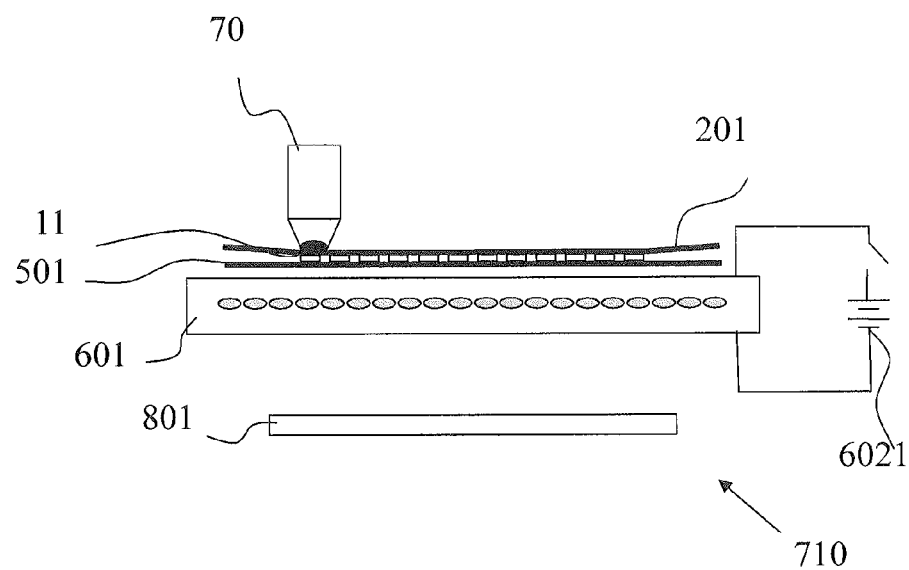
Figure 9:
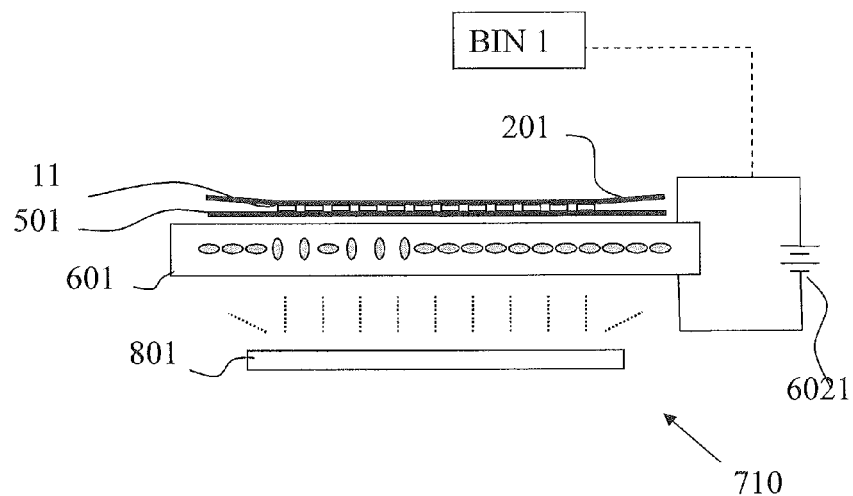
Figure 10:
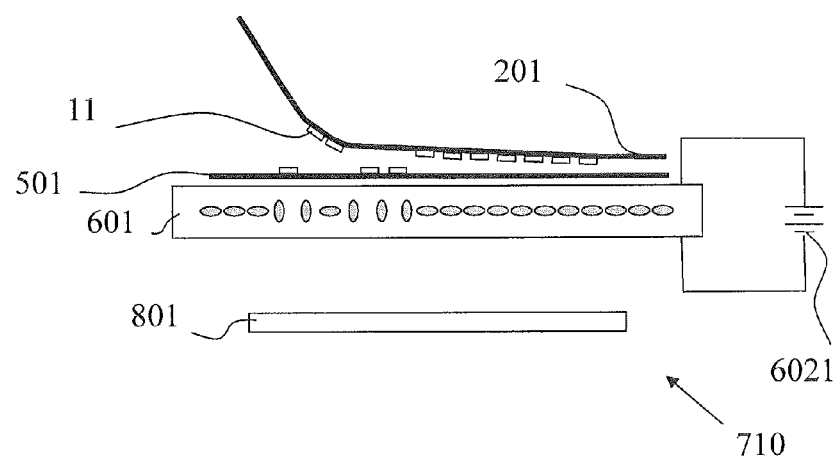

Referring to FIGS. 8 and 9, all chips 11 are adhered to the chip receiver 501 through the pressurization device 70, and meanwhile chips 11 are also adhered to the chip holder 201. A UV light transmitter used as a separator 801 is disposed under the liquid crystal panel. Transmitting the coordinate of the BIN 1 chip to the current controller 602 to control the conductive region of the conductive glass sheets, so as to control the spin degree of liquid crystal. The liquid crystal disposed under the BIN 1 chip can spin to an orientation perpendicular to the conductive glass sheet to form a turn-on path without the liquid crystal in-between. Next, the UV light emitted from the UV light transmitter can pass through the turn-on path, the glass sheet, the chip receiver 501, BIN 1 chips without being barred by the liquid crystal and then is emitted on the chip holder 201, and the adhesion of the chip holder 201 made of the UV tape is decreased because of the UV light. Referring to FIG. 10, chips other than BIN 1 chips and the chip holder 201 are removed from the chip receiver 501, such as tearing off the chip holder 201 made of the UV tape by hand. Because the adhesion between the UV blue tape without being emitted by light and the chip 11 is greater than that between the chip receiver 501 and the chip 11, the chips other than BIN 1 chips are separated from the chip receiver 501 when the UV tape is torn off. Only BIN 1 chips are left on the chip receiver 501, and the first sorting is finished. Next, replacing a chip receiver 501 to proceed with BIN 2 chip sorting.

Those having ordinary skill in the art will readily observe that numerous modifications and alterations of the device and method may be made while retaining the teachings of the invention. Accordingly, the above disclosure should be construed as limited only by the metes and bounds of the appended claims.

What is claimed is:

1. A method of transferring a chip from a chip holder to a chip receiver comprising:
   providing the chip holder having a first surface;
   providing multiple chips on the first surface;
   providing the receiver having a second surface, wherein the second surface faces the first surface, wherein the material of the chip receive comprises an adhesive material;
   attaching the multiple chips to the second surface;
   decreasing an adhesion between the multiple chips and the first surface; and
   separating the multiple chips from the first surface after the step of decreasing the adhesion between the multiple chips and the first surface.

2. The method according to claim 1, wherein the material of the chip holder comprises an adhesive material.

3. The method according to claim 1, wherein the step of attaching the multiple chips to the second surface comprises pressuring a position of the chip holder corresponding to a position of the first surface for attaching the multiple chips to the second surface.

4. The method according to claim 1, wherein the step of decreasing the adhesion between the multiple chips and the first surface comprises spreading a solvent on the chip holder to decrease the adhesion between the multiple chips and the first surface.

5. The method according to claim 1, wherein the step of decreasing the adhesion between the multiple chips and the first surface comprises irradiating the chip holder by a light to decrease the adhesion between the multiple chips and the first surface.

6. The method according to claim 1, wherein the step of separating the multiple chips from the first surface comprises moving the chip holder or the chip receiver to separate the multiple chips from the first surface.

7. The method according to claim 1, wherein the multiple chips are categorized to a same BIN number according to an optoelectronic requirement of the multiple chips.

8. The method of chip sorting according to claim 7, wherein the optoelectronic requirement of the multiple chips comprises luminance, wavelength, driving voltage, or current.

9. The method according to claim 1, further comprising defining coordinates of the multiple chips on the first surface before attaching the multiple chips to the second surface.

10. The method according to claim 1, wherein the step of providing the multiple chips onto the first surface comprising:
    attaching a wafer onto the first surface of the chip holder; and
    separating the wafer into the multiple chips.

11. A method of transferring a chip from a chip holder to a chip receiver comprising:
    providing a wafer;
    separating the wafer into the multiple chips;
    providing the chip holder having a first surface;
    attaching the multiple chips on the first surface of the chip holder;
    providing the chip receiver having a second surface, wherein the second surface faces the first surface, the second surface comprises an area greater than or equal to an area of the wafer;
    attaching the multiple chips to the second surface;
    decreasing an adhesion between the multiple chips and the first surface; and
    separating the multiple chips from the first surface after the step of decreasing the adhesion between the multiple chips and the first surface.

12. The method according to claim 1, further comprising:
positioning the multiple chips according to defined coordinates of the multiple chips before the step of attaching the multiple chips.

13. The method according to claim 1, wherein the multiple chips are separated from the first surface simultaneously.

14. The method according to claim 1, wherein the multiple chips are attached to the second surface simultaneously.

15. The method according to claim 1, wherein the step of attaching the multiple chips to the second surface is accomplished by a pressurization device.

16. The method according to claim 1, wherein the step of attaching the multiple chips to the second surface is performed prior to the step of decreasing the adhesion.

* * * * *